(12) United States Patent
Kim et al.

(10) Patent No.: US 7,864,545 B2
(45) Date of Patent: Jan. 4, 2011

(54) CHASSIS BASE ASSEMBLY AND PLASMA DISPLAY PANEL (PDP) ASSEMBLY INCLUDING THE CHASSIS BASE ASSEMBLY

(75) Inventors: Myoung-Kon Kim, Suwon-si (KR); Se-Il Oh, Suwon-si (KR)

(73) Assignee: Samsung SDI Co., Ltd., Giheung-gu, Yongin-si, Gyeonggi-do (KR)

( * ) Notice: Subject to any disclaimer, the term of this patent is extended or adjusted under 35 U.S.C. 154(b) by 1241 days.

(21) Appl. No.: 11/282,628

(22) Filed: Nov. 21, 2005

(65) Prior Publication Data
US 2006/0114663 A1 Jun. 1, 2006

(30) Foreign Application Priority Data
Dec. 1, 2004 (KR) .................. 10-2004-0099819

(51) Int. Cl.
*H05K 7/14* (2006.01)
(52) U.S. Cl. .............. 361/807; 361/809; 361/679.21; 361/810
(58) Field of Classification Search ............. 361/681, 361/752, 807, 809, 679.01, 679.21; 345/905; 313/461
See application file for complete search history.

(56) References Cited

U.S. PATENT DOCUMENTS

| | | | |
|---|---|---|---|
| 6,181,390 B1* | 1/2001 | Wang et al. | 349/58 |
| 6,494,429 B2* | 12/2002 | Tajima | 248/473 |
| 6,542,206 B1* | 4/2003 | Saito | 349/58 |
| 6,700,315 B2 | 3/2004 | Kim et al. | |
| 6,747,713 B1* | 6/2004 | Sato | 349/58 |
| 6,813,159 B2* | 11/2004 | Irie et al. | 361/752 |
| 6,972,963 B1* | 12/2005 | Chou | 361/760 |
| 7,061,177 B2* | 6/2006 | Kang et al. | 313/582 |

(Continued)

FOREIGN PATENT DOCUMENTS

CN 1741718 3/2006

(Continued)

OTHER PUBLICATIONS

*Office action* from the Japanese Patent Office issued in Applicant's corresponding Japanese Patent Application No. 2005-295951 dated Aug. 5, 2008.

(Continued)

*Primary Examiner*—Dameon E Levi
(74) *Attorney, Agent, or Firm*—Robert E. Bushnell, Esq.

(57) ABSTRACT

A chassis base assembly includes a chassis base in which a plurality of slots are formed, and a reinforcing member coupled to the chassis base to protrude through the slots from a surface of the chassis base to the opposite side thereof. A plasma display device assembly includes a panel assembly having a plurality of discharge electrodes formed thereon and forming an image during discharge, a chassis base supporting the panel assembly and having a plurality of slots formed herein, a drive circuit portion coupled to a rear side of the chassis base, a flexible printed cable having end portions respectively connected to each of ports of the panel assembly and each of ports of the drive circuit portion, and a reinforcing member disposed between the panel assembly and the chassis base and reinforcing the chassis base.

19 Claims, 7 Drawing Sheets

U.S. PATENT DOCUMENTS

| | | | |
|---|---|---|---|
| 7,075,241 B2 * | 7/2006 | Kim et al. | 315/169.3 |
| 7,170,759 B2 * | 1/2007 | Soga | 361/825 |
| 7,224,121 B2 * | 5/2007 | Ahn | 313/582 |
| 7,259,958 B2 * | 8/2007 | Bang et al. | 361/681 |
| 7,457,120 B2 * | 11/2008 | Bae et al. | 361/704 |
| 7,505,270 B2 * | 3/2009 | Kim | 361/704 |
| 7,529,082 B2 * | 5/2009 | Maruta | 312/7.2 |
| 7,535,700 B2 | 5/2009 | Chung | |
| 2005/0194913 A1 * | 9/2005 | Kim et al. | 315/169.4 |
| 2005/0258726 A1 * | 11/2005 | Bang | 313/49 |
| 2007/0018577 A1 | 1/2007 | Hwang | |

FOREIGN PATENT DOCUMENTS

| | | |
|---|---|---|
| GB | 2371419 | 7/2002 |
| JP | 10-319863 | 12/1998 |
| JP | 2002-123186 | 4/2002 |
| KR | 10-2003-0016498 | 3/2003 |
| KR | 10-2003-0033718 | 5/2003 |
| KR | 10-2003-0034795 | 5/2003 |

OTHER PUBLICATIONS

Office action from the Chinese Patent Office issued in Applicant's corresponding Chinese Patent Application No. 20051010289306 dated Mar. 20, 2009.

Office action from Chinese Patent Office issued in Applicant's corresponding Chinese Patent Application No. 200510128930.6 dated Oct. 23, 2009.

* cited by examiner

CHASSIS BASE ASSEMBLY AND PLASMA DISPLAY PANEL (PDP) ASSEMBLY INCLUDING THE CHASSIS BASE ASSEMBLY

CLAIM OF PRIORITY

This application makes reference to, incorporates the same herein, and claims all benefits accruing under 35 U.S.C. §119 from an application for CHASSIS BASE ASSEMBLY AND PLASMA DISPLAY PANEL ASSEMBLY USING THE SAME earlier filed in the Korean Intellectual Property Office on 1 Dec. 2004 and there duly assigned Serial No. 10-2004-0099819.

BACKGROUND OF THE INVENTION

1. Field of the Invention

The present invention relates to a Plasma Display Panel (PDP) assembly, and more particularly, to a chassis base assembly of a PDP assembly having an improved structure to increase the tensile strength thereof.

2. Description of the Related Art

Typically, a Plasma Display Panel (PDP) assembly is a flat display device in which a plurality of discharge electrodes are formed on the surfaces of substrates facing each other. A discharge gas is injected into a discharge space and a voltage supplied thereto. An image is formed using light emitted from phosphors due to ultraviolet rays generated by the discharge space.

The PDP assembly is completed by manufacturing and attaching front and rear panels, assembling a chassis base at the rear of the panel assembly, mounting the panel assembly and a driving circuit for transferring an electrical signal at the rear of the chassis base, and installing the assembly in a case after testing.

Japanese Patent Publication No. 2002-123186 relates to a plasma display device having a structure in which at least a front side is arranged to face a plurality of transparent substrates, a panel main body has a plurality of discharge cells, a metal chassis member supports the panel main body using an adhesive, and a linear reinforcing member is arranged in the adhesive. Accordingly, the panel main body can be easily separated from the chassis member.

Korea Patent Publication No. 2003-33718 relates to a plasma display device including a PDP, a chassis base arranged parallel to the PDP, a rib formed by bending the edge of the chassis base toward a side of the chassis base, a thermal transfer medium disposed between the PDP and the chassis base, and a drive circuit installed on a side of the chassis base opposite to a side thereof where the PDP is attached and connected to the PDP to drive the PDP. Beads are formed on the surface of the chassis base. The beads are pressed on the surface of the chassis base and include a section portion where a plurality of polygons and closed curves are connected, a branch portion extending toward the edge of the chassis base from a plurality of points on an outer circumference of the section portion, and a bead having a shape of a sickle and formed on each corner portion of the chassis base. Thus, the plasma display device having a reinforced pressed chassis base is provided through the above-noted bead process.

Korea Patent Publication No. 2003-16498 relates to a plasma display device having a structure in which a chassis base having a circuit board mounted on a surface thereof and dissipating heat generated by a PDP to the outside and supporting the PDP to secure a bending strength while the structure of a pressed frame is not deformed, and a plurality of reinforcing members for reinforcing the strength of the chassis base are fixed to the surface of the chassis base.

Korean Patent Publication No. 2003-34795 relates to a plasma display device in which, to minimize a warp of a thin chassis base, the structure of a reinforcement rib formed on the chassis base is improved so that a mold becomes simplified, the chassis base supports a PDP so that the heat generated by the panel and circuits are smoothly dissipated, the reinforcement rib and a boss are integrally formed on a rear surface of the chassis base to mount a circuit board, and the reinforcement rib is arranged to not be parallel to a horizontal axis set to the chassis base.

A plasma display device assembly includes a panel assembly having a front panel and a rear panel attached to the front panel, and a chassis base attached to a rear side of the panel assembly using an adhesive unit. The adhesive unit includes a heat dissipation sheet simultaneously performing heat dissipation and adhesion functions and a double-sided adhesive tape arranged at the edge of the heat dissipation sheet. A reinforcing member for reinforcing the chassis base is fixed and a plurality of bosses are installed at the reinforcing member.

As described above, securing the reliability of the chassis base by reinforcing the strength of the chassis base acts as one of the important factors in the plasma display device assembly. However, with the technical development in the plasma display device assembly, the thickness of the chassis base has gradually decreased. That is, the thickness of a typical chassis base formed of an aluminum alloy has decreased from 2.0 mm to 1.5 mm, 1.2 mm, and 1.0 mm. As the chassis base becomes thinner, a coupling force at a coupling portion between the reinforcing member and the chassis base is reduced when a local tensile force is generated. Also, as the thickness of the chassis base decreases, the chassis base is easily deformed so as to be severely deformed by an external impact.

SUMMARY OF THE INVENTION

The present invention provides a chassis base assembly of a Plasma Display Panel (PDP) assembly having an improved structure with a reinforcing member to increase the tensile strength thereof, and a plasma display device assembly adopting the reinforcing member and the chassis base assembly.

According to one aspect of the present invention, a chassis base assembly is provided including: a chassis base including a plurality of slots arranged therein; and a reinforcing member attached to the chassis base to protrude through the plurality of slots from one surface of the chassis base to an opposite side thereof.

The chassis base preferably has an inner space including an area of the chassis base protruding to a rear side of the chassis base and a fixing portion in which one of the plurality of slots is arranged at the protruding portion of the chassis base.

The fixing portion is preferably drawn in the chassis base.

The reinforcing member is preferably arranged in the inner space and includes: a base portion attached to the chassis base along an inner surface of the fixing portion; and a flat portion bent from the base portion to the rear side of the chassis base and protruding through the slot to the outside.

The fixing portion preferably has a size sufficient for the inner space to accommodate the whole reinforcing member. The fixing portion preferably has a height corresponding to that of the reinforcing member.

The reinforcing member preferably includes: a base portion attached to the chassis base along a surface of the chassis base; and a flat portion bent from the base portion to the rear side of the chassis base to protrude through the slot to the other surface of the chassis base.

A plurality of bosses that protrude to the other surface of the chassis base are preferably arranged on the reinforcing member.

The reinforcing member is preferably attached to the chassis base using one coupling unit selected from a group consisting of Tox fasteners, screws, rivets, and welding.

According to another aspect of the present invention, a plasma display device assembly is provided including: a panel assembly having a plurality of discharge electrodes arranged thereon and adapted to form an image during a discharge; a chassis base supporting the panel assembly and having a plurality of slots arranged therein; a drive circuit attached to a rear side of the chassis base; a flexible printed cable having end portions respectively electrically connected to each of ports of the panel assembly and each of ports of the drive circuit; and a reinforcing member arranged between the panel assembly and the chassis base and adapted to reinforce the chassis base.

The reinforcing member is preferably arranged in a space within the chassis base, the space being an area of the chassis base protruding in a direction opposite to the panel assembly, and a fixing portion having one of the plurality of slots is preferably arranged at the protruding portion of the chassis base.

The fixing portion is preferably drawn in the chassis base.

The inner space preferably has a size and depth sufficient to accommodate the whole reinforcing member such that the reinforcing member is arranged on a same horizontal plane, or at an inner position, with respect to a surface of the chassis base facing the panel assembly.

The reinforcing member preferably includes: a base portion attached to an inner surface of the chassis base; and a flat portion bent from the base portion to the rear side of the chassis base and protruding through the slot to the outside.

The fixing portion preferably has a height corresponding to that of the reinforcing member.

The reinforcing member preferably includes: a base portion attached to an inner surface of the chassis base facing the panel assembly; and a flat portion bent from the base portion in a direction opposite to the panel assembly through the slot.

The reinforcing member is preferably attached to the chassis base using one coupling unit selected from a group consisting of Tox fasteners, rivets, screws, and welding.

A plurality of bosses are preferably arranged on the reinforcing member in a direction opposite to the panel assembly.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
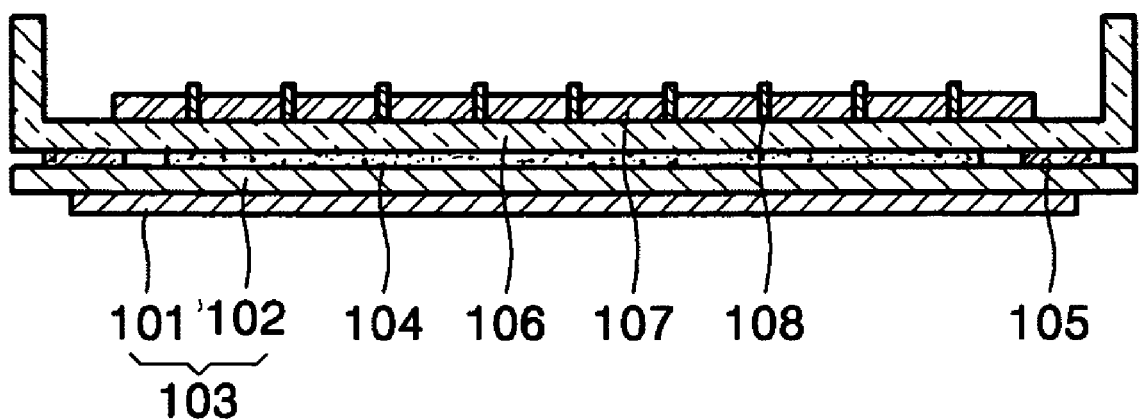
FIG. 1 is a cross-sectional view of a plasma display device assembly.

FIG. 1 is a cross-sectional view of a plasma display device assembly. Referring to FIG. 1, the plasma display device assembly includes a panel assembly 103 having a front panel 101 and a rear panel 102 attached to the front panel 101, and a chassis base 106 attached to a rear side of the panel assembly 103 using an adhesive unit. The adhesive unit includes a heat dissipation sheet 104 simultaneously performing heat dissipation and adhesion functions and a double-sided adhesive tape 105 arranged at the edge of the heat dissipation sheet 104. A reinforcing member 107 for reinforcing the chassis base 106 is fixed and a plurality of bosses 108 are installed at the reinforcing member 107.

As described above, securing the reliability of the chassis base by reinforcing the strength of the chassis base acts as one of the important factors in the plasma display device assembly. However, with the technical development in the plasma display device assembly, the thickness of the chassis base has gradually decreased. That is, the thickness of a typical chassis base formed of an aluminum alloy has decreased from 2.0 mm to 1.5 mm, 1.2 mm, and 1.0 mm. As the chassis base becomes thinner, a coupling force at a coupling portion between the reinforcing member and the chassis base is reduced when a local tensile force is generated. Also, as the thickness of the chassis base decreases, the chassis base is easily deformed so as to be severely deformed by an external impact.

Figure 2:
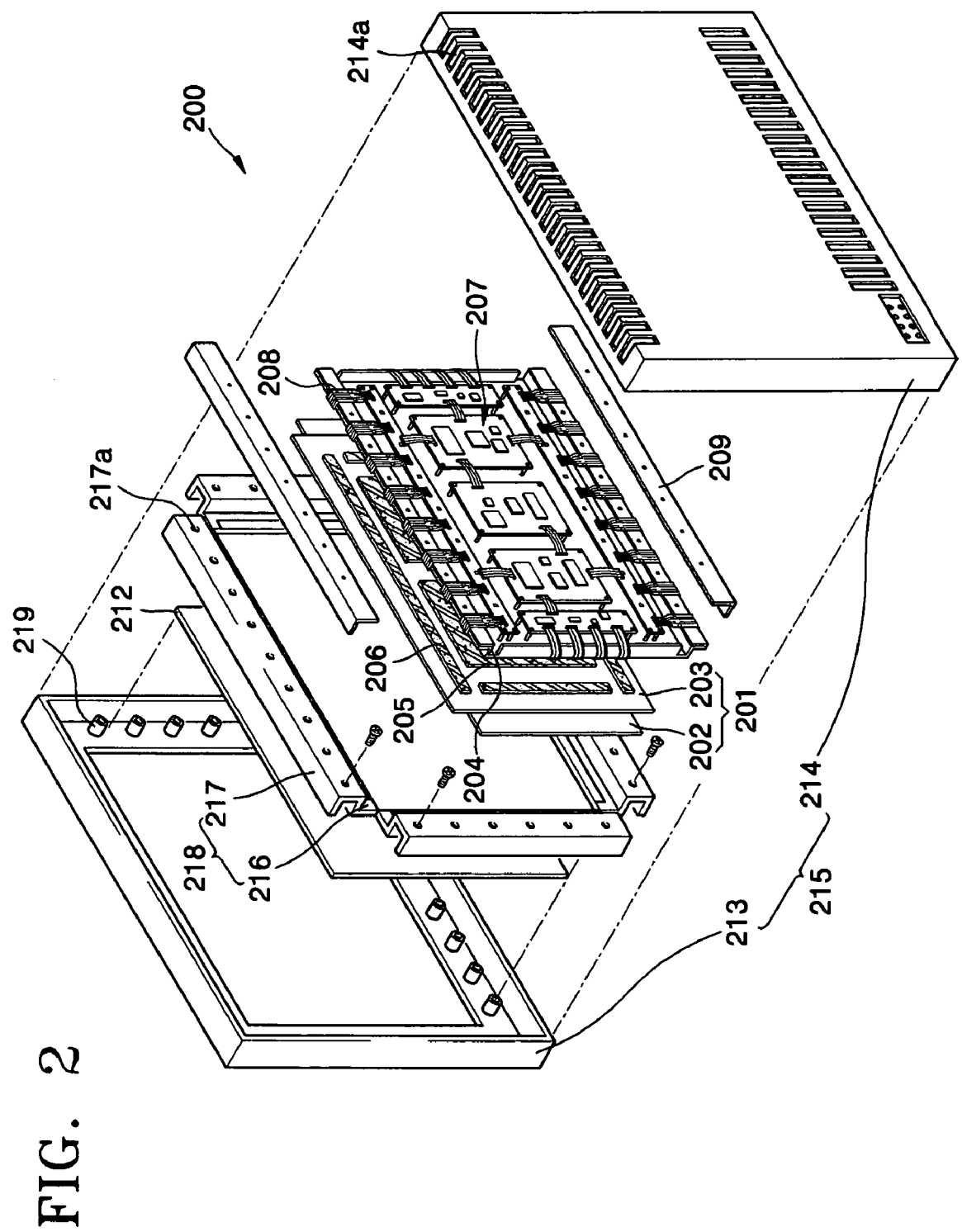
FIG. 2 is a perspective view of a plasma display device assembly according to an embodiment of the present invention.

Referring to FIG. 2, a plasma display device assembly 200 according to an embodiment of the present invention includes a panel assembly 201 having a front panel 202 and a rear panel 203 arranged to face the front panel 202. When the panel assembly 201 is a 3-electrode surface discharge device, the front panel 202 includes a pair of discharge sustaining electrodes (not shown), a dielectric layer (not shown) covering the discharge sustaining electrodes, and a protective layer (not shown) deposited on a surface of the dielectric layer. The rear panel 203 includes an address electrode (not shown) arranged in a direction across the discharge sustaining electrodes and a rear surface dielectric layer (not shown) covering the address electrode.

A discharge space is defined between the front and rear panels 202 and 203. A partition wall is installed to prevent cross-talk. Red, green, and blue phosphor layers are respectively coated on an interior surface of the partition wall. Also, frit glass is coated on the edge of an inner surface of each of the front and rear panels 202 and 203 facing each other to attach the front and rear panels 202 and 203 together while forming a seal. The sealed discharge space is filled with a discharge gas in which Ne, He, Ar or a mixture gas thereof is mixed with a small amount of Xe.

A chassis base 204 is arranged at the rear of the panel assembly 201. The chassis base 204 is attached to the panel assembly 201 using an adhesive unit. The adhesive unit includes a heat dissipation sheet 205 disposed at the center of the outer surface of the rear panel 203 and simultaneously performing a heat dissipation function and an adhesion function and a double-sided adhesive tape 206 disposed at the edge of the outer surface of the rear panel 203 to reinforce the adhesive force. The heat dissipation sheet 205 provides a path along which the heat generated by the panel assembly 201 is dissipated to the outside directly or via the chassis base 204.

A drive circuit 207 is installed on the rear side of the chassis base 204. A plurality of circuits are arranged on the drive circuit 207. A flexible printed cable 208 is provided to electrically connect each electrode port of the panel assembly 201 and the drive circuit 207 to transfer electrical signals therebetween.

A cover plate 209 is attached to the upper and lower portions of the rear side of the chassis base 204 and separated from the chassis base 204 in the lengthwise direction. The flexible printed cable 208 is accommodated between the upper and lower portions of the chassis base 204 and the cover plate 209.

A filter assembly 212 is installed in front of the panel assembly 201. The filter assembly 212 is installed to block electromagnetic waves, infrared rays, neon light emission, and external light generated by the panel assembly 201.

The panel assembly 201, the chassis base 204, and the filter assembly 212 are accommodated in a case 215. The case 215 includes a front cabinet 213 installed in front of the filter assembly 212 and a cover back 214 installed at the rear of the chassis base 204. A plurality of vent holes 214a are formed at the upper and lower portions of the cover back 214.

A filter holder 218 is installed at the rear surface of the filter assembly 212. The filter holder 218 includes a pressing portion 216 to press the filter assembly 212 against the front cabinet 213 and a fixing portion 217 bent backward from the press portion 216. A plurality of coupling holes 271a are formed in the fixing portion 217.

A filter installation portion 219 is installed on the rear surface of the front cabinet 213. The filter installation portion 219 is disposed to face the fixing portion 217 and fixes the filter assembly 212 with respect to the front cabinet 213 through a screw coupling.

A plurality of slots (not shown) are formed in the chassis base 204. A reinforcing member to reinforce the chassis base 204 is installed on the chassis base 204 to protrude from a side of the chassis base 204 to the opposite side thereof through the slots.

Figure 3:
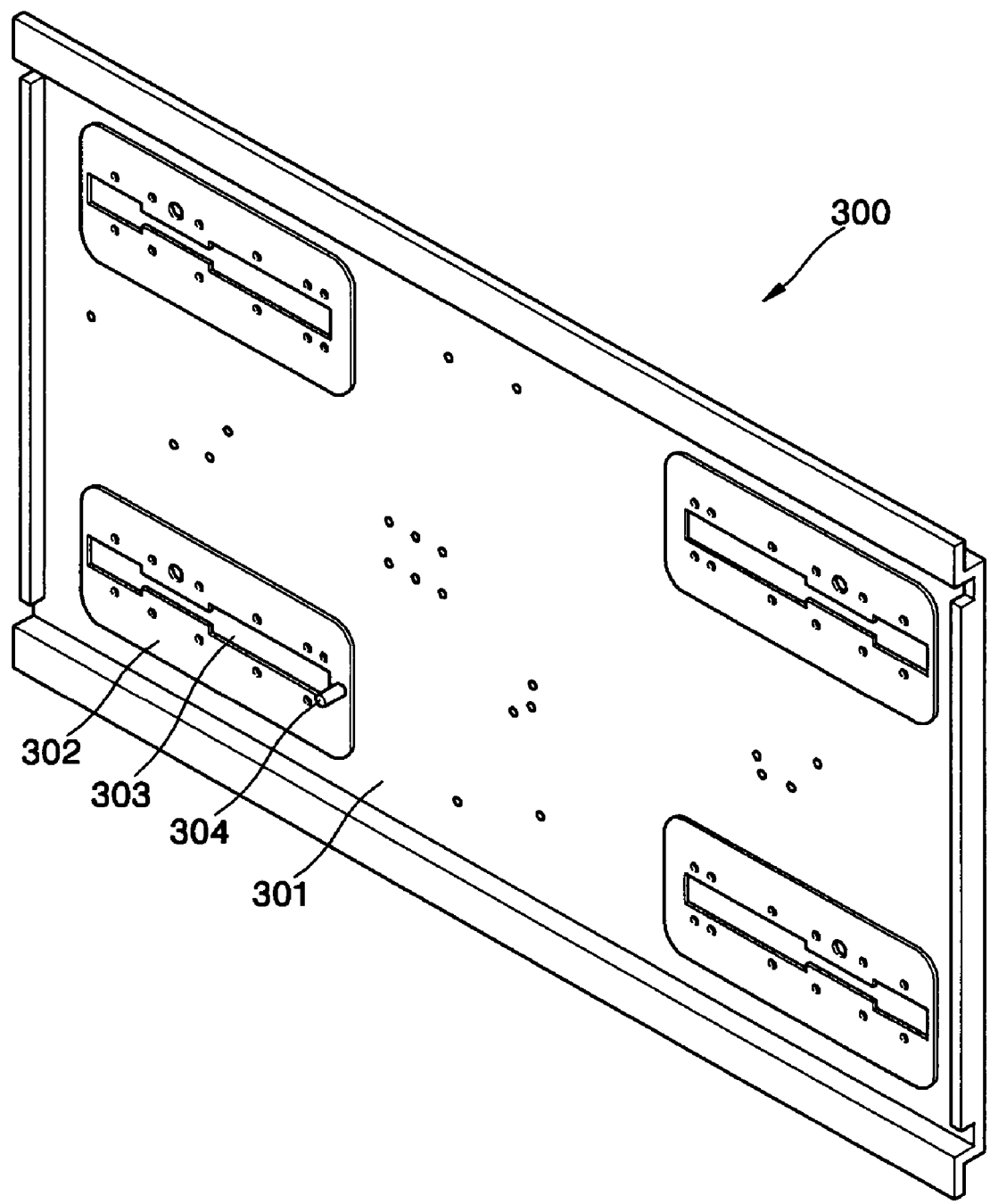
FIG. 3 is a perspective view of a chassis base according to an embodiment of the present invention.
Figure 4:
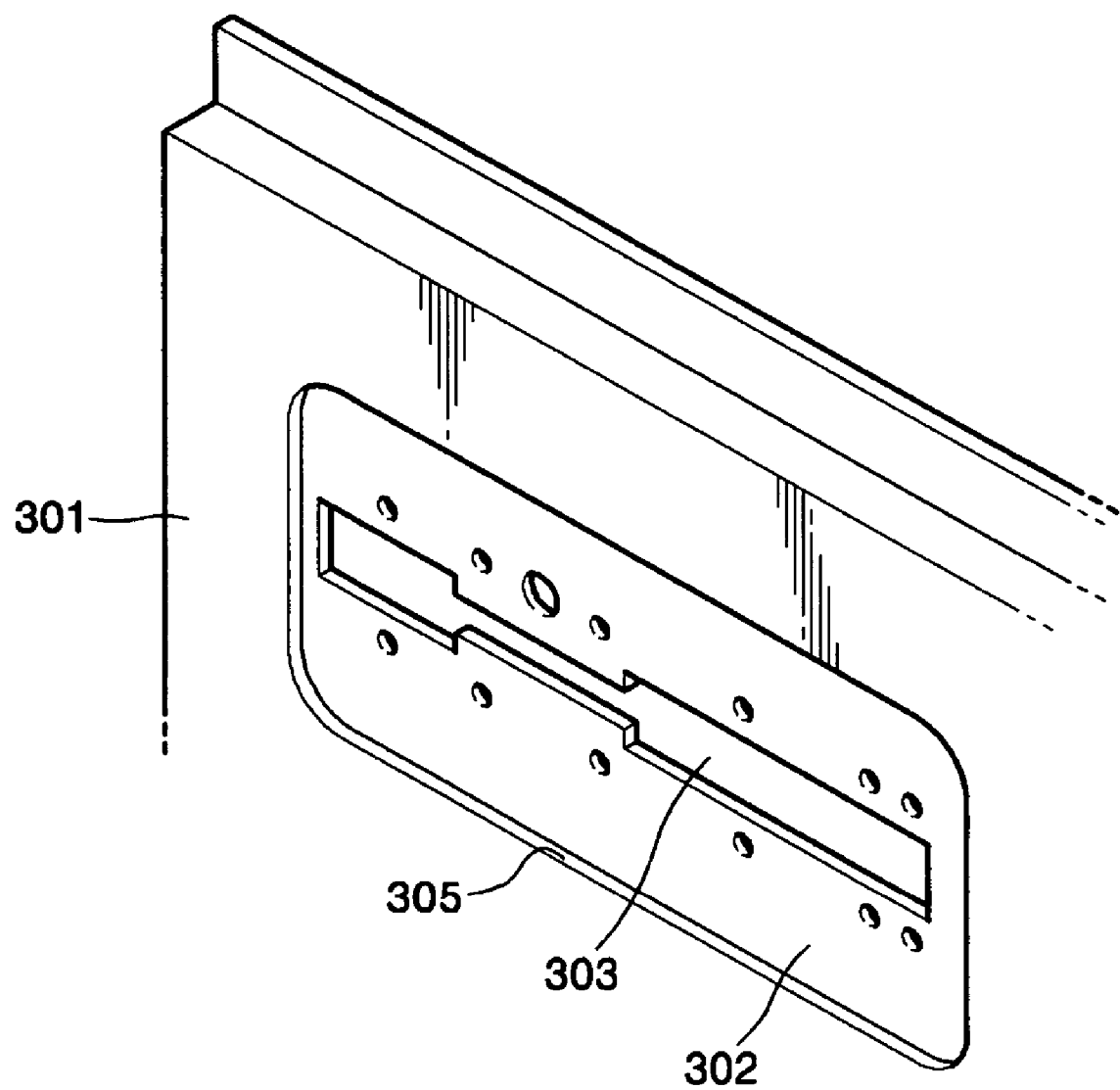
FIG. 4 is a perspective view of the chassis base of FIG. 3 viewed from the opposite side.
Figure 5:
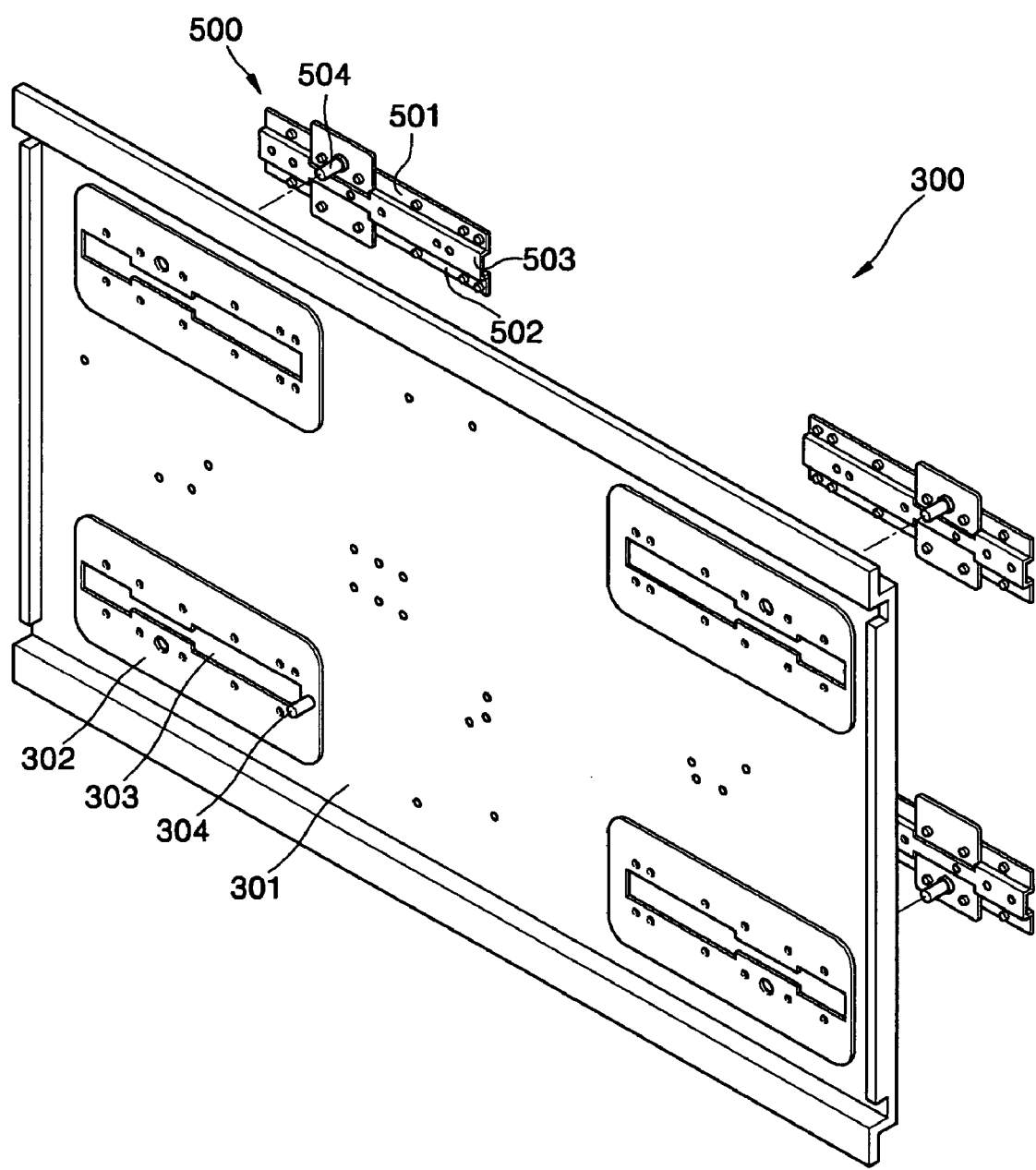
FIG. 5 is an exploded perspective view of a reinforcing member and the chassis base of FIG. 3.

FIG. 3 is a perspective view of a chassis base 300 according to an embodiment of the present invention. FIG. 4 is a perspective view of the chassis base 300 of FIG. 3 viewed from the opposite side. FIG. 5 is an exploded perspective view of a reinforcing member 500 and the chassis base 300 of FIG. 3.

Referring to FIGS. 3 through 5, a main body portion 301 is formed of a flat metal plate, for example, a zinc steel plate, and provided on the chassis base 300. A plurality of fixing portions 302 are formed at a circumferential portion of the main body portion 301. The fixing portions 302 are formed near to the corners of the main body portion 301 that are areas having reduced tensile strength. The fixing portions 302 are at least one area of the main body portion 301 that protrudes in a direction opposite to the panel assembly 201 to accommodate the reinforcing member 500 that is disposed between the panel assembly 201 and the chassis base 300. The fixing portions 302 are rectangles arranged in the lengthwise direction of the chassis base 300. However, the present invention is not limited thereto. Also, a slot 303 is formed in each of the fixing portions 302 along the lengthwise direction at a center portion of each fixing portion 302.

Accordingly, an inner space 305 where the reinforcing member 500 is accommodated is formed in the chassis base 300 by being pulled backward to a predetermined depth when viewed from a surface facing the panel assembly 201. While viewed from the opposite surface to the panel assembly 201, the fixing portions 302 protrude from the main body portion 301 to a predetermined height. The inner space 305 has a size large enough to accommodate the entire reinforcing member 500. This is to prevent interference occurring when the reinforcing member 500 protrudes from the surface of the main body portion 301 facing the panel assembly 201 toward the panel assembly 201.

The reinforcing member 500 includes first and second base portions 501 and 502 fixedly attached to the fixing portions 302 by being accommodated in the inner space 305 where the fixing portions 302 are installed, and a flat portion 503 bent from the first and second base portions 501 and 502. That is, the first and second base members 501 and 502 in strips, each having a length corresponding to the slot 303, are provided at the reinforcing member 500. The flat portion 503 is bent backward integrally from the edges of surfaces facing the first and second base portions 501 and 502. The flat portion 503 protrudes from the main body portion 301 through the slot 303. To this end, the width of the flat portion 503 is smaller than that of the slot 303. In the present embodiment, although the cross-section of the reinforcing member 500 has a hat shape, the present invention is not limited thereto and any structure capable of being attached to the fixing portions 302 can be adopted.

Alternatively, in addition to drawing the fixing portions 302 from a surface of the main body portion 301 in a direction opposite to the panel assembly 201, the chassis base 300 and the reinforcing member 500 can be attached by a plurality of the slots 302 formed on the same plane as the chassis base 300, the base portions 501 and 502 being attached to a surface of the chassis base 300, and the reinforcing member 500 being attached through the slots 302 so that the flat portion 503 protrudes from the other surface of the chassis base 300.

A plurality of bosses 504 protrude from the first and second base portions 501 and 502 in a direction opposite to the chassis base 300. The first and second base portions 501 and 502 are fixed to the fixing portions 302 by coupling units selected from Tox fasteners, screws, rivets, and welding.

Figure 6:
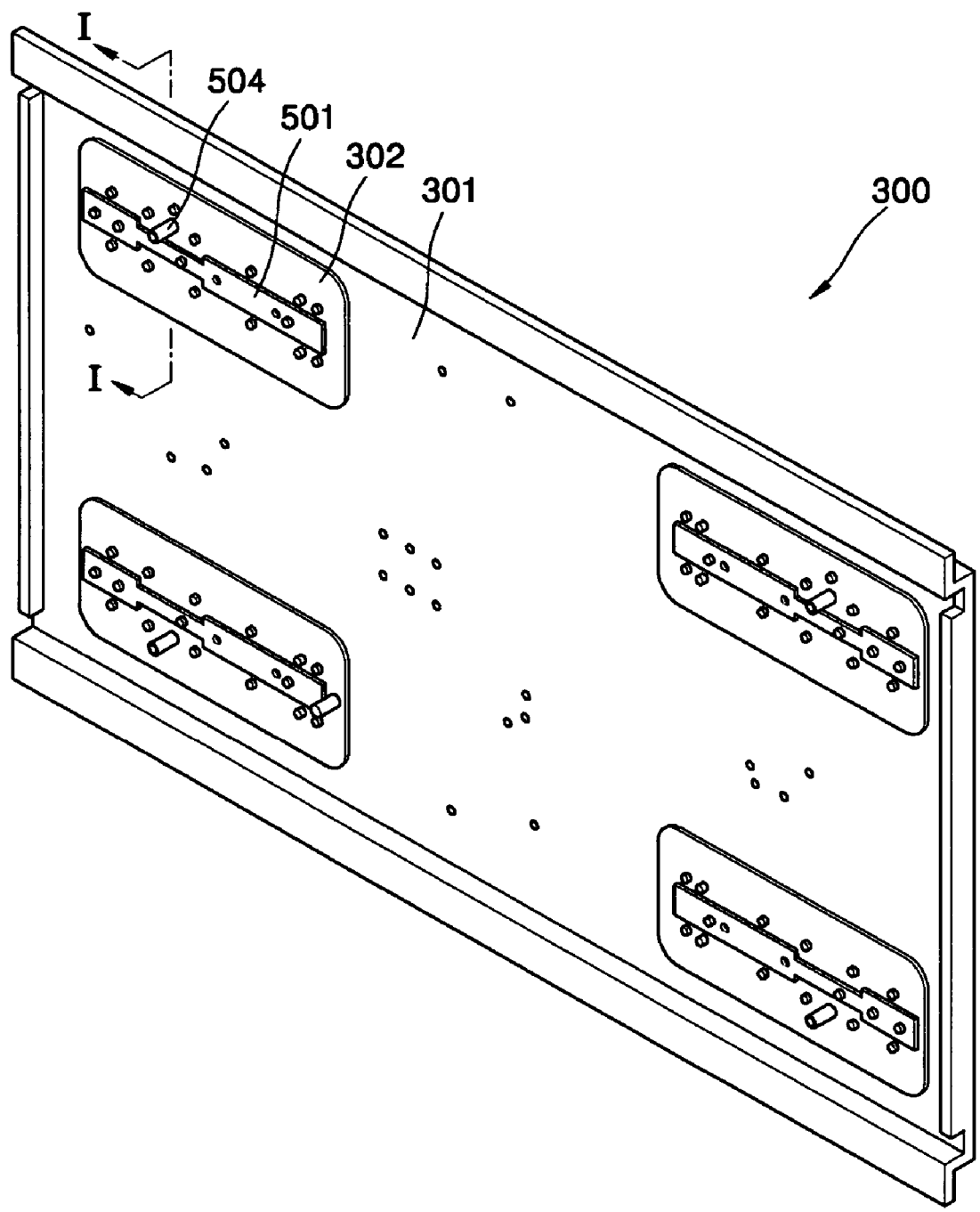
FIG. 6 is a perspective view of the reinforcing member attached to the chassis base of FIG. 5.
Figure 7:
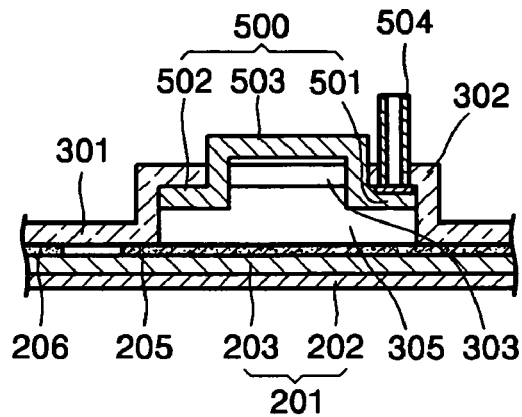
FIG. 7 is a cross-sectional view taken along line I-I of FIG. 6.

FIG. 6 is a perspective view of the reinforcing member 500 attached to the chassis base 300 of FIG. 5. FIG. 7 is a cross-sectional view taken along line I-I of FIG. 6. Referring to FIGS. 6 and 7, the fixing portions 302 protrude from the main portion 301 of the chassis base 300 by being drawn backward. The inner space 305 for accommodating the reinforcing member 500 is formed inside the fixing portions 302.

The inner space 305 has sufficient size and depth to accommodate the reinforcing member 500 such that the reinforcing member 500 is disposed on substantially the same horizontal plane with respect to the inner surface of the main body portion 301 facing the panel assembly 201 or at an inner position than the inner surface of the main body portion 301. Accordingly, the height of the fixing portions 302 protruding from the main body portion 301 is greater than at least the height of the reinforcing member 500.

The reinforcing member 500 is disposed through the inner space 305 to attach the reinforcing member 500 to the chassis base 300. The flat portion 503 of the reinforcing member 500 protrudes through the slot 303 that is rectangular and formed in the fixing portions 302. A portion where the flat portion 503 protrudes is opposite to a portion where the panel assembly 201 is installed.

The reinforcing member 500 is firmly attached to the fixing portions 302 using a coupling unit selected from Tox fasteners, rivets, screws, or welding while the first and second base portions 501 and 502 contact the inner surface of the fixed portion 302. The boss 504 installed on at least one of the first and second base portions 501 and 502 can protrude to the outside through the fixing portions 302, or a portion where the boss 504 protrudes is formed, when the slot 303 is formed, so as to protrude to the outside. When the fixing portions 302 do not protrude and only the slot 303 is formed in the chassis base 300, the base portions 501 and 502 contact the surface of the chassis base 300 facing the panel assembly 201 along the edge of the slot 303. Simultaneously, the flat portion 503 bent backward from the base portions 501 and 501 firmly attaches the reinforcing member 500 to the chassis base 300 when the flat portion 503 protrudes opposite to the panel assembly 201.

The panel assembly 201 is attached to the inner surface of the main body 301 where the reinforcing member 500 is attached to the fixing portions 302, using the heat dissipation sheet 205 and the double-sided adhesive tape 206.

Figure 8:
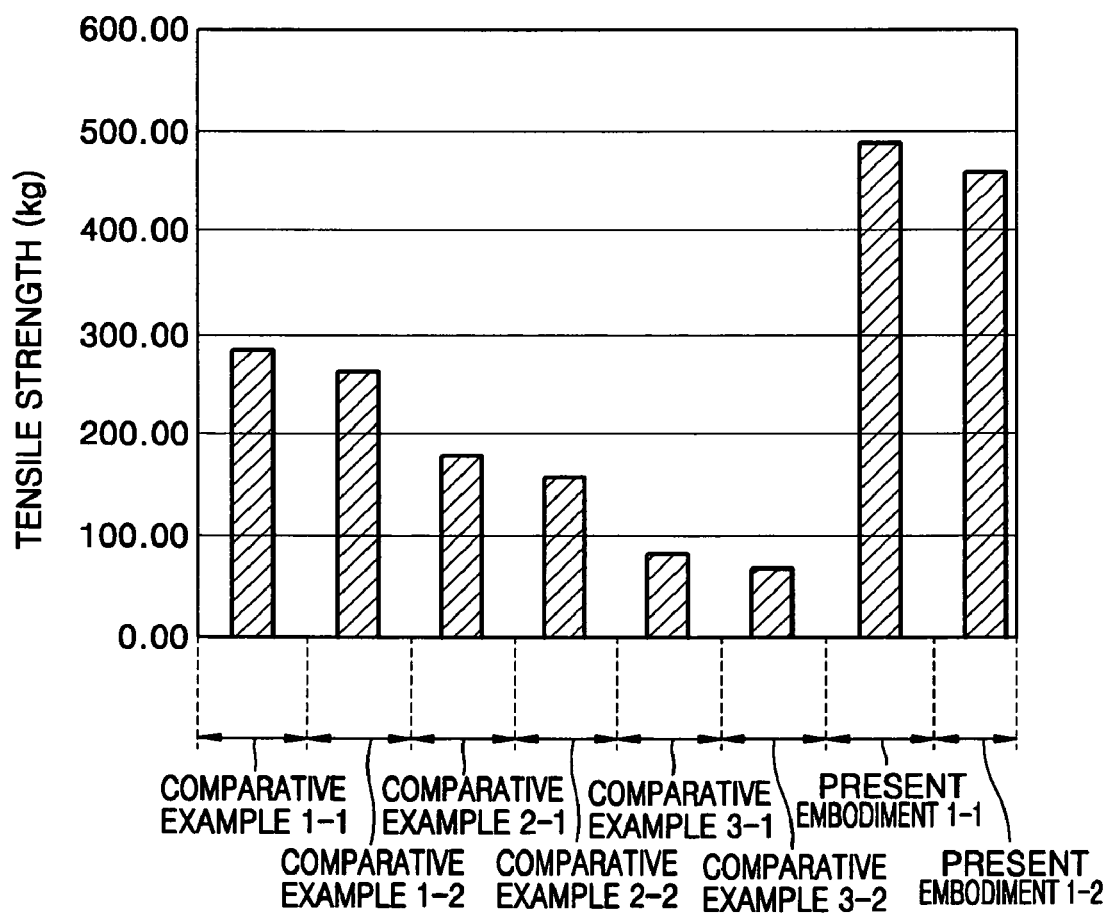
FIG. 8 is a graph of the tensile strengths of different chassis bases.

The results of tests with respect to the deformation of the chassis base 300 when the boss 504 is pulled in one direction are shown in Table 1 and FIG. 8.

TABLE 1

| | Thickness of Chassis Base (mm) | Diameter of Boss (mm) | Tensile Strength (kg) |
|---|---|---|---|
| Comparative Example 1-1 | 2.0 | 8.0 | 280.16 |
| Comparative Example 1-2 | 2.0 | 7.0 | 261.78 |
| Comparative Example 2-1 | 1.5 | 8.0 | 180.13 |
| Comparative Example 2-2 | 1.5 | 7.0 | 161.15 |
| Comparative Example 3-1 | 1.0 | 8.0 | 82.25 |
| Comparative Example 3-2 | 1.0 | 7.0 | 71.30 |
| Present Embodiment 1-1 | 1.0 | 8.0 | 490.35 |
| Present Embodiment 1-2 | 1.0 | 7.0 | 460.24 |

The comparative examples 1-1, 1-2, 2-1, 2-2, 3-1, and 3-2 are according to the conventional technologies in which the reinforcing member is not installed between the panel assembly and the chassis base, but installed at the rear of the chassis base opposed to the panel assembly. In the present embodiments 1-1 and 1-2, the reinforcing member is installed between the panel assembly and the chassis base. The comparative examples 1-1, 1-2, 2-1, 2-2, 3-1, and 3-2 are formed of a flat aluminum plate while the present embodiments 1-1 and 1-2 are formed of a zinc plated steel plate.

Referring to Table 1 and FIG. 8, when in the comparative examples 1-1 and 1-2 the thicknesses of the chassis base are 2.0 mm and the diameters of the boss are 8.0 mm and 7.0 mm, respectively, the tensile strengths are 280.16 kg and 261.78 kg. When in the comparative examples 2-1 and 2-2 the thicknesses of the chassis base are 1.6 mm and the diameters of the boss are 8.0 mm and 7.0 mm, respectively, the tensile strengths are 180.13 kg and 161.15 kg. When in the comparative examples 3-1 and 3-2 the thicknesses of the chassis base are 1.0 mm and the diameters of the boss are 8.0 mm and 7.0 mm, respectively, the tensile strengths are 82.25 kg and 71.30 kg.

In the conventional comparative examples, as the thickness of the chassis base decreases, the tensile force is applied to a local portion of the chassis base. As a result, the tensile strength of the reinforcing member with respect to the chassis base is remarkably reduced so that the chassis base becomes subject to deformation or external impact when other parts are attached thereto.

In contrast, when in the present embodiments 1-1 and 1-2 the thicknesses of the chassis base are 1.0 mm and the diameters of the boss are 8.0 mm and 7.0 mm, respectively, the tensile strengths are 490.35 kg and 460.24 kg. When the comparative examples 3-1 and 3-2 and the present embodiments 1-1 and 1-2 having the same thicknesses are simply compared, the tensile strengths of the embodiments of the present invention remarkably increase from 82.25 kg and 71.30 kg to 490.35 kg and 460.24 kg, respectively.

This is because a predetermined inner space is formed in the inner surface of the chassis base facing the panel assembly and the reinforcing member is coupled through the inner space. As a result, the tensile force applied to the chassis base is in a direction opposite to a direction in which the panel assembly is installed, that is, a direction in which the drive circuit portion is installed, so that the whole chassis base receives the tensile force.

As described above, the plasma display device assembly according to the present invention in which the strength of the chassis base is improved has the following effects.

First, since the reinforcing member is disposed between the panel assembly and the chassis base, as a tensile force is applied in a direction opposite to the panel assembly, although the thickness of the chassis base decreases, the chassis base can be prevented from being deformed or the reinforcing member separated from the chassis base.

Second, the reinforcing member is installed through the inner space provided in the chassis base. The reinforcing member is disposed at a portion of the chassis base where the tensile strength is low. Thus, the tensile force is applied to the whole chassis base so that the deformation of the chassis base can be prevented.

Third, as the chassis base receives all of the tensile force applied thereto, the reinforcing member can be attached to the chassis base by a variety of methods.

Fourth, the coupling force between the reinforcing member and the chassis base can be secured according to the decrease in the thickness of the chassis base, and the reliability of the coupling of other parts can be secured.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. A plasma display device assembly, comprising:
   a chassis base including a plurality of slots arranged therein; and
   a reinforcing member attached to the chassis base to protrude through the plurality of slots from one surface of the chassis base to an opposite side thereof, the reinforcing member comprising:
     a base portion attached to the chassis base along a surface of the chassis base; and
     a flat portion bent from the base portion to the rear side of the chassis base to protrude through the slot to the other surface of the chassis base.

2. The plasma display device assembly as claimed in claim 1, wherein the chassis base has an inner space including an area of the chassis base protruding to a rear side of the chassis base and a fixing portion in which one of the plurality of slots is arranged at the protruding portion of the chassis base.

3. The plasma display device assembly as claimed in claim 2, wherein the fixing portion is drawn in the chassis base.

4. The plasma display device assembly as claimed in claim 2, wherein the reinforcing member is arranged in the inner space.

5. The plasma display device assembly as claimed in claim 4, wherein the fixing portion has a size sufficient for the inner space to accommodate the whole reinforcing member.

6. The plasma display device assembly as claimed in claim 4, wherein the fixing portion has a height corresponding to that of the reinforcing member.

7. The plasma display device assembly as claimed in claim 1, wherein the slots are elongated slots having a predetermined shape.

8. The plasma display device assembly as claimed in claim 1, wherein each reinforcing member includes a boss protruding through the chassis base.

9. The plasma display device assembly as claimed in claim 1, wherein the reinforcing member is attached to the chassis base using one coupling unit selected from a group consisting of Tox fasteners, screws, rivets, and welding.

10. A plasma display device assembly, comprising:
   a panel assembly having a plurality of discharge electrodes arranged thereon and adapted to form an image during a discharge;
   a chassis base supporting the panel assembly and having a plurality of slots arranged therein;
   a drive circuit attached to a rear side of the chassis base;
   a flexible printed cable having end portions respectively electrically connected to each of ports of the panel assembly and each of ports of the drive circuit; and
   a reinforcing member arranged between the panel assembly and the chassis base and adapted to reinforce the chassis base, wherein the reinforcing member comprises:
      a base portion attached to an inner surface of the chassis base facing the panel assembly; and
      a flat portion bent from the base portion in a direction opposite to the panel assembly through the slot.

11. The plasma display device as claimed in claim 10, wherein the reinforcing member is arranged in an inner space within the chassis base, the inner space being an area of the chassis base protruding in a direction opposite to the panel assembly, and wherein a fixing portion having one of the plurality of slots is arranged at the protruding portion of the chassis base.

12. The plasma display device as claimed in claim 11, wherein the fixing portion is drawn in the chassis base.

13. The plasma display device as claimed in claim 11, wherein the inner space has a size and depth sufficient to accommodate the whole reinforcing member such that the reinforcing member is arranged on a same horizontal plane, or at an inner position, with respect to a surface of the chassis base facing the panel assembly.

14. The plasma display device as claimed in claim 11, wherein the slots are elongated slots having a predetermined shape.

15. The plasma display device as claimed in claim 11, wherein the fixing portion has a height corresponding to that of the reinforcing member.

16. The plasma display device as claimed in claim 10, wherein the reinforcing member is attached to the chassis base using one coupling unit selected from a group consisting of Tox fasteners, rivets, screws, and welding.

17. The plasma display device as claimed in claim 10, wherein a plurality of bosses are arranged on the reinforcing member in a direction opposite to the panel assembly.

18. The plasma display device as claimed in claim 1, comprised of:
   a panel assembly having a plurality of discharge electrodes arranged thereon and adapted to form an image during a discharge;
   the chassis base supporting the panel assembly; and
   a drive circuit attached to a rear side of the chassis base electrically connected to each of a plurality of ports of the panel assembly.

19. The plasma display device as claimed in claim 1, comprised of:
   a panel assembly having a plurality of discharge electrodes arranged thereon and adapted to form an image during a discharge;
   the chassis base supporting the panel assembly; and
   a drive circuit attached to a rear side of the chassis base;
   a flexible printed cable having end portions respectively electrically connected to each of a plurality of ports of the panel assembly and each of ports of the drive circuit.

* * * * *